FABRICATION OF DIFFUSED JUNCTION SEMICONDUCTOR DEVICES

Original Filed Dec. 13, 1962

2 Sheets-Sheet 1

JOAN M. CRISHAL,
JAMES P. SANDSTROM,
INVENTORS

BY THEIR ATTORNEYS.

Spensley & Horn.

FABRICATION OF DIFFUSED JUNCTION SEMICONDUCTOR DEVICES

Original Filed Dec. 13, 1962

JOAN M. CRISHAL,
JAMES P. SANDSTROM,
INVENTORS.

BY THEIR ATTORNEYS.

Spensley & Horn.

United States Patent Office 3,476,620

Patented Nov. 4, 1969

3,476,620

FABRICATION OF DIFFUSED JUNCTION SEMICONDUCTOR DEVICES

Joan M. Crishal, Torrance, and James P. Sandstrom, Los Angeles, Calif., assignors to TRW Semiconductors Inc., Lawndale, Calif., a corporation of Delaware Continuation of application Ser. No. 244,326, Dec. 13, 1962. This application Oct. 10, 1968, Ser. No. 769,471
Int. Cl. H01l 7/34, 1/10
U.S. Cl. 148—187 3 Claims

ABSTRACT OF THE DISCLOSURE

A boron diffusion process having highly controllable characteristics and utilizing vapors of n-propyl borate and ethyl silicate whereby a borosilicate glass coating is formed on a semiconductor body and boron atoms are diffused from the glass coating into the semiconductor body. An oxide layer is deposited over the borosilicate glass layer before the diffusion to protect the device and aid in controlling the boron diffusion.

This application is a continuation of application 244,-326 filed Dec. 13, 1962, now abandoned.

This invention relates to the fabrication of diffused junction semiconductor devices and more particularly to a novel diffusion method for boron.

In the art of solid state electronics, the use of semiconductor materials and semiconductor devices for rectifying and controlling electrical signals is now well known. Basic to the theory of operation of semiconductor devices is the concept that current may be carried in two distinctly different manners; namely, "conduction by electrons" or "excess electron conduction," and "conduction by holes" or "deficit electron condition." The fact that electrical conductivity by both of these processes may occur simultaneously and separately in a semiconductor specimen affords a basis for explaining the electrical behavior characteristics of semiconductor devices. One manner in which the conductivity of a semiconductor specimen may be established is by the addition of active impurities to the basic semiconductor material.

The term "semiconductor material" as utilized herein is considered generic to materials such as germanium, silicon, and germanium-silicon alloys, and compounds such as silicon-carbide, indium-antimonide, gallium-antimonide, aluminum-antimonide, indium-arsenide, gallium-arsenide, gallium-phosphorus alloys, indium-phosphorus alloys and the like.

In the semiconductor art, the term "active impurities" is used to denote those impurities which affect the electrical characteristics of the semiconductor material as distinguished from other impurities which have no appreciable effect on these characteristics. Generally, active impurities are intentionally added to the semiconductor material to produce single crystals having predetermined electrical characteristics. Active impurities are classified as either donors, such as antimony, arsenic, bismuth, and phosphorus, or acceptors, such as indium, gallium, boron, and aluminum. A region of the semiconductor material containing an excess of donor impurities and yielding an excess of free electrons is considered to be an impurity doped N type region. An impurity doped P type region is one containing an excess of acceptor impurities resulting in a deficit of electrons, or stated differently, an excess of holes. In other words, an N type region is one characterized by electron conduction while a P type region is one characterized by hole conduction.

A heavily doped region of N type conductivity may alternately be referred to as an $N^+$ region, the plus indicating that the concentration of the active impurity in the region is greater than the minimum required to determine the conductivity type. Similarly, a $P^+$ type region would indicate a more heavily than normal doped region of P type conductivity.

When a continuous, solid crystal specimen of semiconductor material has an N type region adjacent to a P type region, the boundary between them is termed a PN or an NP junction. And the specimen of semiconductor material is termed a PN junction semiconductor device. These PN and NP junctions are referred to as rectifying junctions.

When donor impurity atoms are diffused into an N type semiconductor starting crystal of a given resistivity, a diffused N type region of a different resistivity is produced. The gradation between these two regions of similar conductivity type but of differing resistivity is termed a "non-rectifying junction." Hence, the term "junction," as utilized herein, is intended to include both rectifying and non-rectifying junctions. A rectifying junction establishes a high resistance interfacial condition between two contacting semiconductor regions of opposite conductivity types, thereby resulting in a high impedance barrier which effectively isolates one region from the other. A non-rectifying junction establishes an interfacial condition between two contacting semiconductor regions of the same conductivity type, the impedance of the interfacial barrier depending upon the relative resistivities of the two regions. Non-rectifying junctions are typically used in the establishment of ohmic contacts by doping a surface of a semiconductor body with the same conductivity type impurity to provide a surface region of lower resistivity than that of the underlying semiconductor material, the relative resistivities of the two contacting semiconductor regions providing a fairly low impedance interfacial barrier so that the regions are electrically connected.

At the present state of the art, the impurity doping of semiconductor material is generally accomplished by a diffusion process, typically involving the vapor-solid diffusion of the desired impurity in a furnace in which certain gases are introduced to control the ambient therein. This type of diffusion process is commonly termed the open tube diffusion process, as contrasted to the closed tube diffusion process in which diffusion is carried out in a sealed container, ordinarily in a non-oxidizing atmosphere. The present invention is specifically directed toward an improved boron diffusion source for use in the open tube diffusion process.

There are several prior art open tube active impurity diffusion techniques in current use. In one technique a $B_2O_3$ coated quartz flat is disposed over silicon wafers in a furnace, the heat driving the boron from the flat into the silicon wafers. In another technique boron chloride is used as the diffusion source in a gas flowing system. A third technique involves the painting of the silicon wafers with a suitable liquid organic polymer such as a mixture of trimethoxyboroxine and methyltrimethoxysilane. These techniques provide insufficient control of the amount of boron deposited on the silicon wafers, resulting in a relatively non-uniform concentration of boron atoms as the active impurity on the silicon surfaces. When using a $B_2O_3$ coated flat only a few wafers can be processed at one time and the flat must be periodically recoated to maintain the desired surface concentration. It is difficult to obtain a uniform deposit when utilizing $BCl_3$ in a gas flowing system since the boron deposition is dependent on gas flow patterns. Trimethoxyboroxine attacks silicon to some extent and it is difficult to remove.

Accordingly, the present invention is directed toward an improved diffusion technique in which there is provided a novel active impurity source which obviates the hereinabovementioned disadvantages of the typical prior art techniques.

In accordance with the presently preferred embodiment of this invention, a borosilicate glass is deposited on the semiconductor material by the simultaneous thermal decomposition of a volatile organic silicate (ethyl silicate) and a volatile organic borate (n-propyl borate). The use of this technique results in the deposition of a borosilicate glass on the semiconductor surface, with boron being evenly distributed throughout the glass. The ratio of boron to silicon in the deposited glass may be closely controlled by regulation of the relative starting amounts of ethyl silicate and n-propyl borate, the similarity in the vapor pressures of these two ingredients insuring that the source composition remains substantially unchanged under controlled conditions. The diffusion coefficient for boron into semiconductor materials using the borosilicate glass as a source is dependent upon the boron-silicon ratio in the deposited glass, hence, the surface concentration of the boron is also subjected to close control. The use of the borosilicate glass as a diffusion source also provides an additional advantage in that it can be used as a protective maskant during subsequent handling of the semiconductor material. Or, on the other hand, selective diffusion can be accomplished merely by removing the borosilicate glass from those surface areas where diffusion is not desired.

It is therefore an object of the present invention to provide an improved technique for the diffusion of active impurity atoms into semiconductor materials.

It is also an object of the present invention to provide an improved active impurity diffusion source.

It is another object of the present invention to provide an improved active impurity diffusion source characterized by uniform active impurity concentration at a constant predetermined value.

It is a further object of the present invention to provide an improved boron diffusion technique in which the boron concentration can be carefully controlled.

It is yet another object of the present invention to provide an improved boron diffusion technique in which boron atoms are evenly diffused into the surfaces of semiconductor materials.

It is still a further object of the present invention to provide an improved boron diffusion technique involving the vapor deposition of a borosilicate glass.

It is also an object of the present invention to provide an improved boron diffusion technique in which the diffusion source is a borosilicate glass.

The novel features which are believed to be characteristic of the invention, both as to its organization and the method of operation, together with further objects and advantages thereof will be better understood from the following description considered in connection with the accompanying drawing in which presently preferred embodiments of apparatus suitable for performance of the present invention techniques are illustrated by way of example. It is to be expressly understood, however, that the drawing is for the purpose of illustration and description only, and is not intended as a definition of the limits of the invention.

The inventors have found that the desired uniform boron concentration can be obtained from a diffusion source consisting of silicon dioxide containing a boron compound, i.e., a borosilicate glass if the boron is evenly dispersed throughout the silicon dioxide. In accordance with this invention ethyl silicate is the presently preferred source for providing a silicon dioxide coating upon the surfaces of silicon wafers. The even dispersion of boron in the silicon dioxide is achieved by the codeposition of $SiO_2$ and $B_2O_3$. It has been found that if the borate alone is decomposed, a large variation in deposit thickness occurs, as evidenced by a rainbow array of colors obtained on the wafer surfaces. n-Propyl borate is presently preferred as the boron source compound because its vapor pressure is very close to the vapor pressure of ethyl silicate. Since the vapor pressures of ethyl silicate and n-propyl borate are similar the source composition can be maintained relatively constant, a constant boron-silicon ratio being necessary to insure a constant diffusion coefficient.

Figure 1:
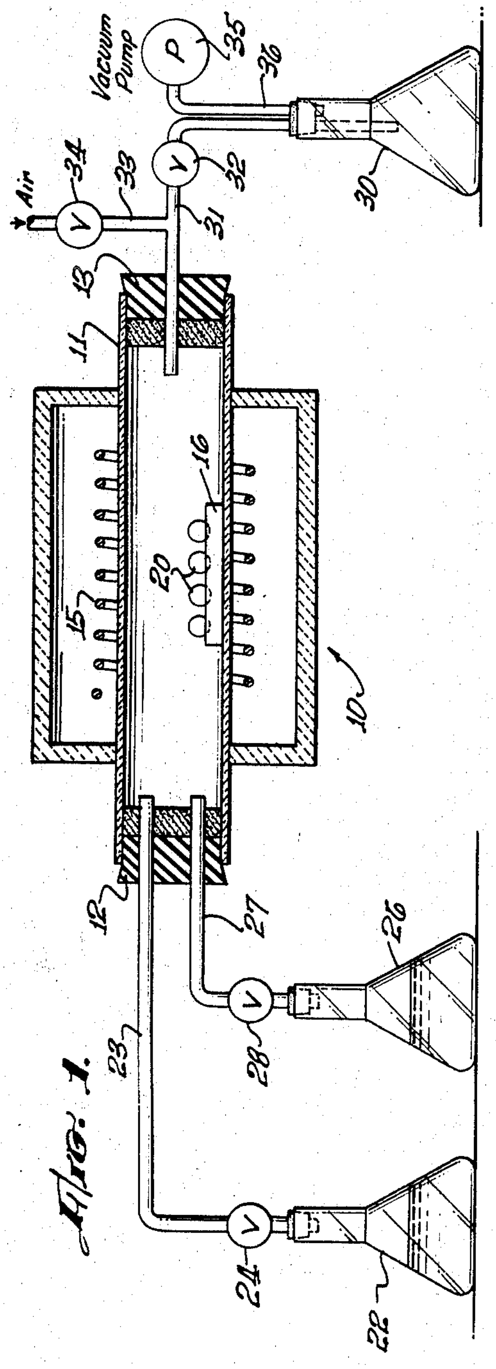
FIGURE 1 is a schematic diagram showing a first embodiment of apparatus suitable for performing the present invention boron diffusion technique.

With reference now the drawings, wherein like or corresponding parts are designated by the same reference characters throughout the several views, there is shown in FIGURE 1 apparatus suitable for performance of the present invention deposition technique to achieve relatively high boron surface concentrations. The apparatus includes an open tube diffusion furnace generally indicated by the reference numeral 10, of the type well known in the art. The furnace 10 contains an elongate quartz tube 11, with the left hand end of the tube being shown as the input end. The input end is provided with an inlet 12 in the form of an end cap through which the desired vapors are introduced into the furnace for a flow toward the right hand, or outlet end, of the tube. The outlet end of the tube is provided with an outlet 13 in the form of an end cap through which the vapors leave the furnace. A heating coil 15 surrounds an intermediate portion of the tube 11 to define the furnace hot zone. Disposed within the hot zone of the furnace is a quartz boat 16 containing a plurality of silicon wafers 20 into which it is desired to diffuse boron atoms. The quartz boat 16 is slotted, the wafers 20 being held in vertical alignment by inserting them into slots which are aligned parallel to the direction of gas flow. In order to insure uniform boron concentrations, it has been found necessary to provide a minimum wafer separation of approximately ⅛ inch.

A flask 22, containing a quantity of ethyl silicate, is positioned near the furnace inlet 12 and connected thereto by a pipe 23, control of the flow of ethyl silicate vapors being provided by a manually operable valve 24. A flask 26, containing a predetermined mixture of ethyl silicate and n-propyl borate, is also positioned near the furnace inlet 12 and connected thereto by a pipe 27, control of the flow of the mixed vapors being provided by a manually operable valve 28.

The furnace outlet 13 is coupled to the inlet of a liquid trap 30 by means of a pipe 31, the pipe 31 including a manually operable valve 32. Coupled to the pipe 31, intermediate the furnace outlet 13 and the valve 32 is a pipe 33 containing an air inlet valve 34 to allow the introduction of ambient air into the system when it is desired to break vacuum. The outlet of the trap 30 is coupled to a vacuum pump 35 by means of a pipe 36.

The flasks and piping may be of any chemically inert, heat resistant material, such as Pyrex glass, for example. Teflon coated stopcocks are convenient for use as the manually operable valves.

As mentioned hereinabove, the surface concentration of boron is dependent upon the relative starting amounts of ethyl silicate and n-propyl borate. In the fabrication of diffused junction semiconductor devices, there are two typical ranges of boron surface concentration desired. In the formation of the emitter and collector regions of PNP transistors and in the formation of the P region in a semiconductor diode, a minimum surface concentration of about $10^{20}$ atoms per cubic centimeter is frequently desired. In the formation of the base region in an NPN transistor, a lower boron surface concentration is usually desired, typically within the range of from about $10^{18}$ to $4\times10^{18}$ atoms per cubic centimeter. The high boron concentrations, i.e., $10^{20}$ atoms/cm.$^3$ and greater, can be obtained when using the apparatus of FIGURE 1 by employing a mixture of two parts by volume ethyl silicate and one part by volume n-propyl borate in the flask 26. The aforementioned lower surface concentration can be obtained by employing a mixture of 50 parts by volume ethyl silicate and one part by volume n-propyl borate in the flask 26. The borosilicate deposition is preferably carried on at a temperature within the range of from about 675° C. to 700° C., the system being evacuated to a pressure below about 0.1 mm. mercury.

To perform a borosilicate diffusion run with the apparatus of FIGURE 1, the wafers 20 are loaded into the quartz boat 16 and the boat placed in the hot zone of the furnace. The desired mixture of ethyl silicate and n-propyl borate is placed in the flask 26 and a quantity of pure ethyl silicate is placed in the flask 22. The flasks are coupled to the system with the valves 24 and 28 closed. The furnace is heated to the deposition temperature within the aforementioned temperature range. The valve 34 is closed and the valve 32 is opened, the vacuum pump 35 being activated to reduce the system pressure and establish the operating vacuum. The valve 28 is then opened while valve 24 remains closed to allow the vacuum to cause the mixed vapors of ethyl silicate and n-propyl borate to flow through the furnace and across the heated wafers 20 where decomposition occurs. The vacuum simultaneously removes the reaction products so that decomposition is relatively fast, a 1–2 minute deposition time being sufficient. The following reactions are believed to occur:

$$2x(RO)_3B \rightarrow xB_2O_3 + \text{volatile organic mixtures}$$
$$y(RO)_4Si \rightarrow ySiO_2 + \text{volatile organic mixtures}$$

The mixed vapors of ethyl silicate and n-propyl borate are allowed to flow for about one minute, at which time the valve 28 is closed and the valve 24 promptly opened to allow pure ethyl silicate vapors to be drawn through the furnace for a period of about four minutes to establish a protective oxide layer upon the borosilicate glass and thereby prevent thermal etching and evaporation of the deposited boron. Upon completion of this four minute period, the valve 24 is closed and the vacuum pump shut down. Opening of the valve 34 breaks the vacuum and the furnace end caps can then be removed.

The borosilicate glass coated wafers are then ready for a two hour diffusion run conducted at a temperature of about 1200° C. It is presently preferred to conduct the first fifteen minutes of the diffusion period in a $CO_2$ atmosphere, with the remainder of the diffusion being conducted in an oxygen atmosphere. It is necessary to utilize a gas which is inert with respect to the semiconductor material during the initial part of the diffusion in order to establish the surface concentration. The subsequent oxidizing atmosphere is employed to obtain the desired final oxide thickness and also apparently improves the reverse characteristics of the resulting semiconductor device. The desired diffusion depth can be obtained by control of the diffusion time as well as control of the temperature and of the ambient gas. For example, a boron surface concentration in excess $10^{20}$ atoms/cm.$^3$ with a diffusion depth of about five microns is obtained by using a 2:1 silicate borate mixture in the flask 26 and following the above-described procedure.

The use of a mixture of ethyl silicate and n-propyl borate, together with the apparatus of FIGURE 1 is presently preferred because it provides more consistently reproducible results than other systems tried within the concepts of the present invention. The changing of source composition is insignificant when utilizing a 2:1 mixture of ethyl silicate and n-propyl borate, due primarily to the similarity of their vapor pressures. By utilizing a relatively large volume of the 50:1 mixture for the lower surface concentrations, in conjunction with the short deposition time, repeated deposition runs may be made before a noticeable change in results occurs.

As an alternative method, instead of utilizing a silicate-borate mixture as the starting composition, separate containers of an organic silicate solution and an organic borate solution can be used, thereby allowing individual adjustment of liquid temperatures and hence of vapor pressures. For example, when utilizing the apparatus of FIGURE 1 in performing this alternative method to achieve boron surface concentrations in excess of $10^{20}$ atoms/cm.$^3$, the flask 22 can contain pure ethyl silicate and the flask 26 can contain n-propyl borate, both of the flasks being maintained at room temperature. Both of the valves 24 and 28 are opened during a five minute deposition run at the above-mentioned furnace temperature and system vacuum.

To achieve the aforementioned lower surface concentrations, the n-propyl borate is maintained at about 0° C., such as by disposing the flask 26 in an ice bath. By use of this alternative method, organic silicates and organic borates of dissimilar vapor pressures can be used while avoiding the effect of changing source composition that would be encountered if a mixture of an organic silicate and an organic borate of dissimilar vapor pressures were used in the hereinabove-described first preferred method.

Figure 2:
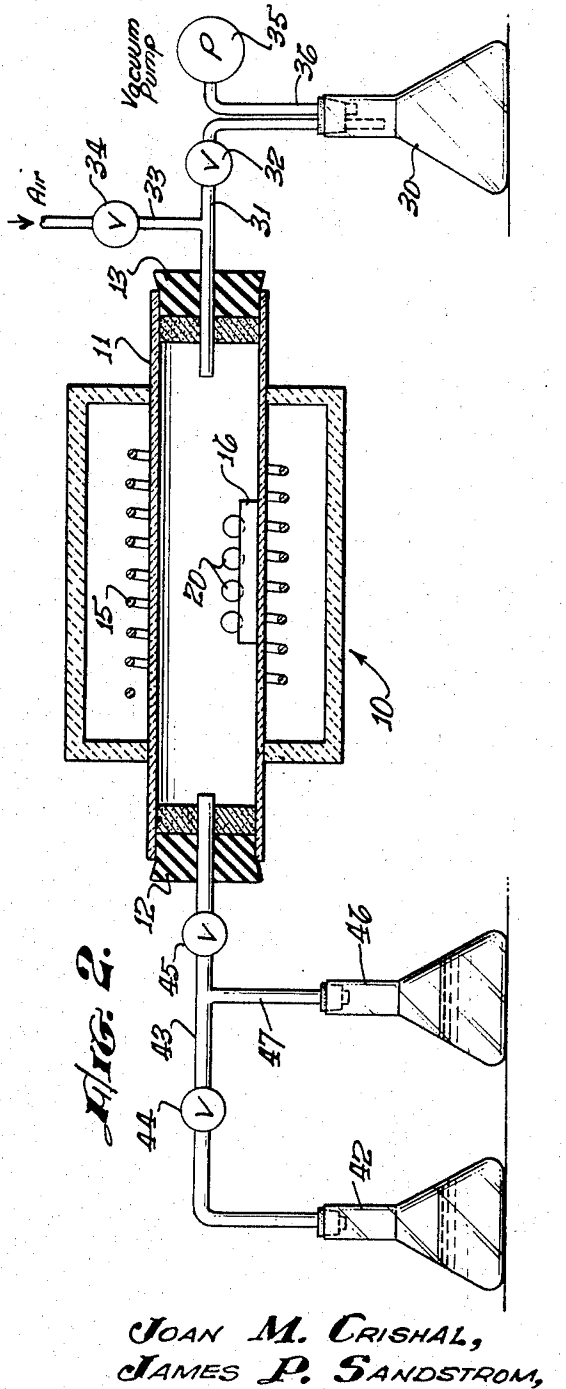
FIGURE 2 is a schematic diagram showing a second embodiment of an apparatus suitable for performing the present invention boron diffusion technique.

An alternative embodiment of apparatus suitable for performance of the alternative method of the present invention is shown in FIGURE 2 of the drawing. In the schematic diagram of FIGURE 2, a flask 42, containing the organic borate, is coupled to the furnace inlet 12 by means of a pipe 43. The pipe 43 is provided with two manually operable valves 44 and 45. A flask 46, containing the organic silicate, is coupled to the pipe 43 intermediate the valves 44 and 45 by a pipe 47. In the FIGURE 2 apparatus, both of the valves 44 and 45 are open during the deposition run. A very close control of vapor pressures is necessary for lower boron concentrations and, in such cases, the vapor flow rate should be monitored with flow meters. For example, with both of the flasks 42 and 46 maintained at room temperature, lower boron concentrations can be achieved at low flow rates by establishing a 5:1 to 10:1 ratio of silicate/borate flow rates. The apparatus of FIGURE 2 is chiefly usable when maintaining the liquids at room temperature, the apparatus of FIGURE 1 being more suitable when maintaining the two liquids at different temperatures.

It has been observed that when utilizing the alternative method in which separate silicate and borate liquids are employed, the final surface concentration decreases with increasing deposition furnace temperature, and also on consecutive deposition runs performed without cleaning the furnace tube between runs. The decomposition rate of the ethyl silicate increases with temperature, while the limited amount of borate apparently begins to decompose and deposit as soon as it reaches a minimum temperature. When the furnace temperature is increased, more borate decomposes before it reaches the center of the furnace hot zone and less boron oxide is deposited on the wafers. This deposit on the surface tube apparently catalyzes the decomposition of the borate, and even less borate reaches the center of the furnace on subsequent runs. In order to minimize this effect, it is presently preferred to utilize a quartz liner which is cleaned with hydrofluoric acid prior to each run, thereby obviating the impractical necessity of cleaning the furnace tube after each run. The furnace tube is then dried out and deactivated by heating in air for approximately two hours. Even when utilizing a quartz liner, this effect is variable and so the alternative method does not provide as reproducible results as the presently preferred method utilizing a liquid mixture of silicate and borate.

When utilizing the presently preferred method, with flow meters included in the system, increasing boron surface concentration on consecutive deposition runs is frequently observed. The maximum flow in the system is decreased by the construction offered by the flow meters. The amount of boron oxide deposited in consecutive runs is apparently dependent on the total flow (that is the flow of earlier runs), and at the lower flow rates contamination in the furnace tube from prior runs tends to increase the surface concentration. This effect is minimized by using the aforementioned 50:1 mixture deposition followed by the plain oxide deposition.

While the present invention method has been described in accordance with a preferred embodiment wherein boron is the active impurity element, other volatile compounds may be used in accordance with the present invention method. Organic borates other than n-propyl borate and organic silicates other than ethyl silicates may clearly be used.

In order to set forth the invention in its most general context, the following should be considered. The present invention may be thought of as a method for depositing a glass coating upon the surface of a semiconductor body to serve as a source of diffusion for one or more active impurity elements by establishing the glass coating from a vapor source by which a uniform deposition of the active impurity may be closely controlled as to overall concentration and as to uniformity of deposition. Preferably, two vapors are used, one containing the active impurity, and the other serving to provide the glass source. It is consistent with the present invention method however to employ a single vapor which itself will generate the glass coating and will include the active impurity source. In order to therefore generalize the present invention method it may be viewed as follows. A first volatile compound designated as Compound A should be a compound which includes an active impurity element and it should have a sufficient volatility so as to be able to be transported from its source to the position of a semiconductor crystal body upon which deposit of the active impurity is desired. The group A compound may thus be defined as a volatile compound at least one element of which is capable of forming an oxide which is a glass former or a glass modifier or which can enter into the network of a poly-component glass and wherein the element is an active impurity. The terms "glass former," "glass modifier," and "poly-component glass" are to be interpreted in accordance with their customary usage in the ceramics art. More specifically, the term "glass former" pertains to glass forming oxides which can, by themselves, form glass, typical examples of glass formers being boron, silicon, germanium, aluminum, phosphorous, vanadium, arsenic, antimony and zirconium. The term "glass modifier" pertains to oxides having bond strengths which are insufficient to enable these oxides to enter into the glass network structure, i.e., those with bond strengths less than 60 kilocalories per mole. A group of oxides called "intermediates" do not form glasses themselves, but can enter into the network in poly-component glasses. Thus, the addition of an intermediate oxide to a glass former will result in a poly-component glass. Examples of such Group A compounds other than n-propyl borate (which is a glass former) are as follows:

| | |
|---|---|
| Aluminum isopropoxide | Glass former and/or intermediate. |
| Isopropylborate | Glass former. |
| Triethylphosphate | Do. |
| Trimethylarsine | Do. |
| Trimethylstibine | Do. |
| Trimethylgalline | Glass modifier. |
| Triethylindine | Do. |

By the term "intermediate," when referring to aluminum isopropoxide, is meant that the aluminum therein is capable of forming an oxide which can enter into a network of a polycomponent glass.

When the Group A compound is itself a glass former it is not absolutely necessary to include any other reagent if in addition this compound includes oxygen so that indeed the oxide of the element may be a glass former or a glass modifier or an intermediate. Even in those instances however, where the Group A compound satisfies all of these conditions, it is desirable to include another compound (such as ethyl silicate) hereinafter to be defined the Group B compound. It serves to permit great control over the concentration of the deposition of the Group A compound which includes the active impurity and therefore permits control of the concentration of the active impurity element. In addition the presence of the Group B compound serves to permit a more homogeneous deposition and it further serves to minimize erosion of the formed glass during the subsequent diffusion heating operation at which time the active impurity element is driven into the semiconductor substrate. The Group B compound may be defined as a volatile compound at least one element of which is capable of forming an oxide, which oxide is a glass former. It may or may not include an active impurity as one of its elements. Examples other than ethyl silicate of suitable Group B compounds and which do not include active impurities are: methylsilicate and tetramethylgermane. Examples of Group B compounds which include active impurities are n-propyl borate, aluminum isopropoxide, triethylphosphate and triethylarsine.

If neither the Group A nor Group B compounds includes oxygen an external source of a form of oxygen is, i.e., $O_2$ or $O_3$, is necessary in order to permit the formation of a glass.

By the use of the expression "volatile" to modify the word "compound" in the Group A or B definition, what is meant simply is that the compound whether it be liquid, solid or gaseous must have a sufficient vapor pressure to permit it to be transported from the source to the semiconductor substrate where it is to be deposited. The vapor pressure may be that which exists at room temperature or it may be necessary to heat the source in order to achieve a sufficient vapor pressure for the above stated purposes. A limitation on the temperature to which the source may be heated is that it should not be higher than either the semiconductor substrate or the complex such as tubing, etc., which connects the source to the furnace housing the substrate; otherwise the vapor would condense on the walls of the complex and would not reach the substrate.

Figure 3:
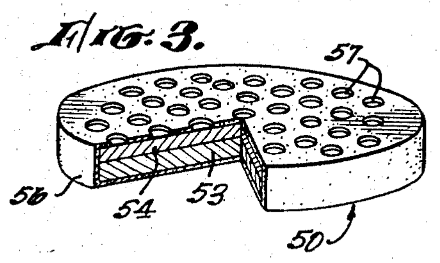
FIGURES 3–11 show the various manufacturing steps involved in the production of a diode employing the present invention diffusion method.
Figure 4:
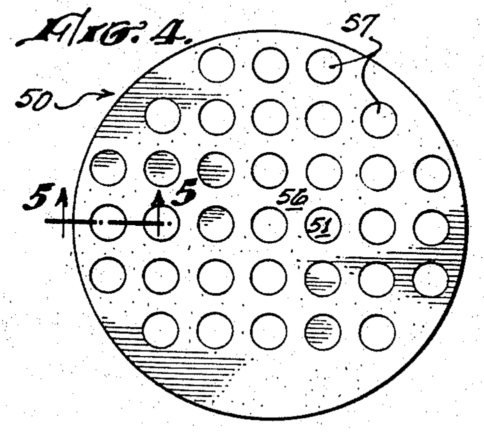
Figure 5:
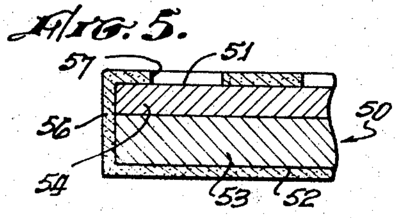

A specific example will now be given in which the present method is utilized in the mass production of a particular semiconductor device commonly known as a planar diode. Ordinarily, in the manufacture of diffused junction semiconductor devices, regions of differing conductivities are formed by diffusion of an active impurity of one conductivity type over the entirety of one main surface of a semiconductor wafer of the opposite conductivity type. This technique usually results in the termination of a junction at the edge of the wafer. The presence of any contaminants or irregularities at the junction may deleteriously affect the electrical characteristics of the device. Typically, some sort of a protective or passivation coating is applied over the device, primarily to isolate the junction from the ambient. It is, therefore, desirable to have the junction terminate in a planar main surface of the wafer rather than at its edge to facilitate the passivation effect of whatever coating may be applied, the planar main surface being considerably larger and a more perfect surface than the edge. Accordingly, there has been recently developed diffused junction semiconductor devices in which all of the junctions terminate in one planar surface, this type of structure being formed by diffusing a small island region of one conductivity type within a surface of the opposite conductivity type. Such devices are commonly identified by the prefix "planar," examples being planar diodes and planar transistors. FIGURES 3–9 of the drawings show various views of a semiconductor wafer during the fabrication of a plurality of planar diodes from a starting semiconductor wafer. FIGURES 3–5 show various views of the semiconductor wafer at an early state of production of the planar diodes. A starting semiconductor crystal wafer 50 has an upper surface 51 and a lower surface 52. The disc shaped wafer 50 is from about 4.9 to 5.2 mils thick and is of N type silicon having a resistivity of 1.5–3.0 ohm-cm. N type active impurity atoms have been diffused into the lower surface 52 of the wafer 50 to create an $N^+$ region 53, of extremely low resistivity, extending into the wafer from its lower surface, the remaining uppermost portion of the wafer defining an N region 54 of the original starting resistivity. Any well known diffusion process can be used, such as, for example, an open tube diffusion using phosphorus as the impurity. Subsequent to the aforementioned diffusion step, a sterile oxide coating 56 is established on the surfaces of the wafer 50 using any well known method, such as thermal oxidation or the pyrolysis of ethyl silicate, for example. The oxide coating 56 acts as a surface passivation coating and also as a mask during subsequent fabrication steps. A series of circular holes 57 are created through the oxide coating on the upper surface of the wafer 50 for the purpose of confining a diffusion operation to a precise geometrical pattern. The circular holes through the oxide coating may be formed through the use of a silk screening decal, by wax coating and scribing, or by a photolithographic method such as the so-called photo-resist process. At this early state of production, the wafer 50 will appear as shown in FIGURES 3–5 which depict perspective, plan and fragmentary views.

Figure 6:
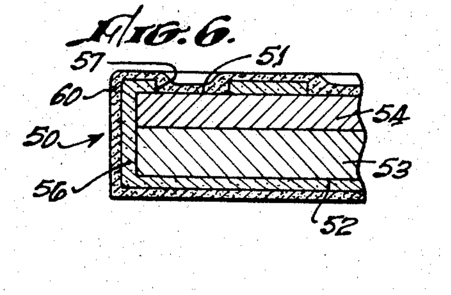

The next step in the production process is to establish a borosilicate glass coating 60 on the surfaces of the wafer of FIGURE 5, using the present invention techniques. The borosilicate deposition is conducted utilizing the apparatus of FIGURE 1, the wafer 50 being disposed in the quartz boat 16 and loaded into the furnace 10. The flask 26 contains a mixture of fifty parts by volume ethyl silicate and one part by volume n-propyl borate, the flask 22 containing pure ethyl silicate. The deposition run is conducted in the manner described hereinabove with reference to the explanation of FIGURE 1, the furnace temperature being 685° C. The mixed vapors of ethyl silicate and n-propyl borate are allowed to flow from the flask 26 for one minute, at which time the valve 28 is closed and the valve 24 promptly opened to allow pure ethyl silicate vapors to be drawn through the furnace for a period of four minutes. Upon establishing the borosilicate glass coating 60, the wafer will appear as shown in FIGURE 6.

Figure 7:
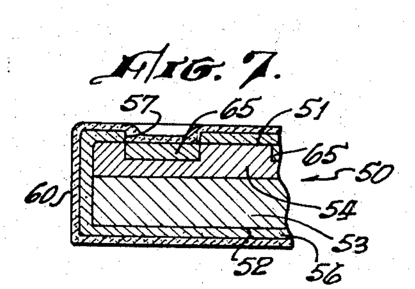

Next, the borosilicate glass coated wafer is disposed in a furnace maintained at a temperature of 1200° C., for a period of two hours to cause boron atoms to diffuse into the upper surface 51 of the wafer 50 within the holes 57 in which the borosilicate glass contacts the wafer surface. The first fifteen minutes of the diffusion period is conducted in a $CO_2$ atmosphere, the remainder of the diffusion being conducted in an oxygen atmosphere. Upon completion of the diffusion run, a P type region 65 extends inwardly from the upper surface of the wafer within each of the holes 57, the wafer then appearing as shown in FIGURE 7. The surface resistivity of the P region 65 is less than 20 ohms per square. The P region is from 7 to 9 microns in thickness and the $N^+$ region 53 is from 3.9 to 4.1 mils thick.

Figure 8:
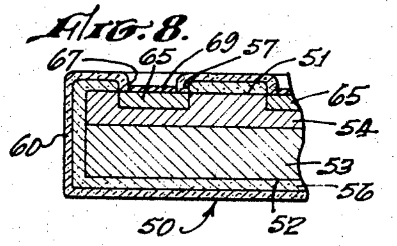
Figure 9:
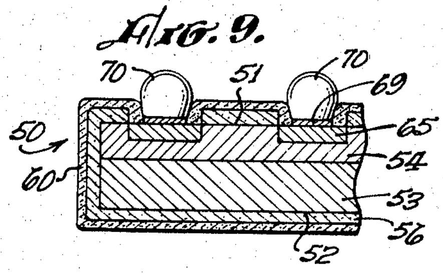

The next production step is to create a circular hole 67, four mils in diameter, through the borosilicate glass coating 60 within the central portion of each of the holes 57, to thereby expose a central portion of each P type surface region 65. Again, any well known technique such as the photo-resist process may be utilized. Next, metallized regions are formed in ohmic contact with the exposed P type semiconductor surface regions to provide for electrical connection thereto. A disc-shaped metallized region 69 is formed over the exposed central portion of each of the P type island regions 65. The metallized regions 69 are formed by first coplating gold and nickel together, utilizing the method disclosed and claimed in U.S. Patent No. 2,995,473, entitled "Method of Making Electrical Connection to Semiconductor Bodies," by Clifford A. Levi, issued Aug. 8, 1961, and also assigned to the present assignee. The gold and nickel are codeposited to form metallized regions 69 approximately one to two microns in thickness, the wafer then appearing as shown in FIGURE 8.

Next, silver contacts 70 are formed on the metallized regions 69 by immersing the wafer 50 in a silver electroplating solution, the wafer 50 being maintained in the electroplating solution until the electroplated silver builds up to a thickness of about 20 to 30 microns. It has been found that when electroplating is initially begun in a confined area, upon further unrestricted build-up of the electroplated layer, the thickness of the layer will increase at approximately the same rate as the lateral spreading. Hence, the electrical contacts 70 will project above the surface of the borosilicate glass coating 60 and will be of the general shape shown in FIGURE 9.

Figure 10:
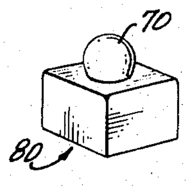
Figure 11:
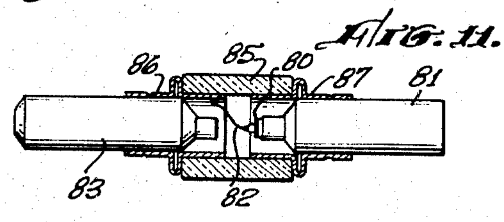

Next, those portions of the oxide coating 56 and the overlying borosilicate glass coating 60 are removed from the bottom of the wafer to expose the $N^+$ type bottom surface 52 and the wafer is diced to form a plurality of devices. FIGURE 10 shows one of the die resulting upon dicing of the starting wafer 50, the die being generally indicated by the reference numeral 80.

The die 80 is then encapsulated in a housing of the type disclosed in U.S. Patent No. 2,815,474, entitled "Glass Sealed Semiconductor Rectifier," issued to H. Frazier and W. Lewis on Dec. 3, 1957. The exposed $N^+$ bottom surface of the die 80 is ohmically bonded to the end of a metal electrode pin 81. The electrode pin 81 and another electrode pin 83 are maintained in coaxial relationship by an envelope consisting of a glass cylinder 85 into each end of which are fused metal shells 86 and 87. One end of a thin gold wire whisker lead 82 is spot welded to the silver contact 70, the other end of the whisker lead 82 being spot welded to the projecting tip portion of the metal shell 86. The shell 86 is hermetically sealed to the pin 81. Hence, the planar diode 80 is hermetically sealed within its housing and the semiconductor crystal body forming the heart of the device is sealed within protective oxide and borosilicate glass coatings.

The planar diodes resulting from the fabricational steps hereinabove described with reference to FIGURES 3–10 have the following parameters.

| | |
|---|---|
| $E_s$ | 100 volts. |
| $I_{+1}$ | 50 milliamperes. |
| $I_{-50}$ | 0.002 microampere. |
| $C_{-0}$ | 1.5 micromicrofarads. |
| $T_{-rr}$ | 15 nanoseconds, between 10 and −10 ma. limitations. |

Each of the planar diodes fabricated from the starting crystal wafer 50 will have substantially identical electrical characteristics, due to the uniformity of the P regions achieved through use of the present invention techniques, these characteristics being readily reproducible on a mass production basis.

Thus, there has been described a novel boron diffusion technique which is simple and convenient in operation, and provides a uniform boron distribution which can be carefully controlled. These desirable results are obtained by the codeposition of $SiO_2$ and $B_2O_3$, the borosilicate glass being vacuum deposited on the semiconductor material in the presently preferred embodiment by the simultaneous thermal decomposition of ethyl silicate and n-propyl borate. The described vacuum deposition of the borosilicate glass provides for uniform oxide thickness and uniform boron concentration across the semiconductor surfaces, together with the additional advantages of extremely low thermal etching and a reduced tendency for the wafers to stick together when they are stacked. Although the n-propyl borate is presently preferred as the boron source for use with the ethyl silicate, those skilled in the art will appreciate that the vapors of other organic borates and other organic silicates may be suitable for certain applications. For example, organic borates such as ethyl borate or methyl borate could be used with a certain degree of process control provided by the hereinabove-described alternative method, even though their vapor pressures are significantly greater than that of the ethyl silicate. Or, if wider variations in final boron concentration can be tolerated, these other organic borates could be utilized in the hereinabove-described presently preferred method. Furthermore, although in the illustrated apparatus embodiments, a vacuum is used to cause the flow of vapors across the semiconductor vapors, the desired vapor flow can be established by other methods, such as by blowing the vapors across the wafers, for example. However, a vacuum system is presently preferred since it insures against contamination of the ambient surrounding the semiconductor wafers. Thus, although the invention has been described with a certain degree of particularity, it is understood that the present disclosure has been made only by way of example and that numerous changes in the details of construction and the combination and arrangement of parts may be resorted to without departing from the spirit and the scope of the invention as hereinafter claimed.

What is claimed is:

1. In the manufacture of a semiconductor device the method of diffusing boron atoms into a silicon semiconductor body comprising the steps of:

(a) disposing the semiconductor body within an enclosure;

(b) flowing the vapors of ethyl silicate and n-propyl borate through said enclosure and across said semiconductor body, said vapors establishing the ambient atmosphere within said enclosure;

(c) maintaining said semiconductor body within a first predetermined temperature range for a time sufficient to cause the thermal decomposition of said vapors to thereby establish a borosilicate glass coating upon said body;

(d) subsequently exposing said coated body to the vapors of ethyl silicate while maintaining said body within said first predetermined temperature range; and, (e) heating said semiconductor body to a second predetermined temperature and for a time sufficient to cause diffusion of boron atoms from said glass into said body.

2. In the manufacture of a semiconductor device the method of diffusing boron atoms into a silicon semiconductor body comprising the steps of:

(a) disposing the semiconductor body within an enclosure;

(b) flowing the vapors of ethyl silicate and n-propyl borate, each being secured from a separate container, through said enclosure and across said semiconductor body, said vapors establishing the ambient atmosphere within said enclosure;

(c) maintaining said semiconductor body within a first predetermined temperature range for a time sufficient to cause the thermal decomposition of said vapors to thereby establish a borosilicate glass coating upon said body;

(d) subsequently exposing said coated body to the vapors of ethyl silicate while maintaining said body within said first predetermined temperature range; and, (e) heating said semiconductor body to a second predetermined temperature and for a time sufficient to cause diffusion of boron atoms from said glass into said body.

3. In the manufacture of a semiconductor device the method of diffusing boron atoms into a silicon semiconductor body comprising the steps of:

(a) disposing the semiconductor body within an enclosure;

(b) flowing the vapors of ethyl silicate and n-propyl borate, both being secured from a single container, through said enclosure and across said semiconductor body, said vapors establishing the ambient atmosphere within said enclosure;

(c) maintaining said semiconductor body within a first predetermined temperature range for a time sufficient to cause the thermal decomposition of said vapors to thereby establish a borosilicate glass coating upon said body;

(d) subsequently exposing said coated body to the vapors of ethyl silicate while maintaining said body within said first predetermined temperature range; and (e) heating said semiconductor body to a second predetermined temperature and for a time sufficient to cause diffusion of boron atoms from said glass into said body.

References Cited

UNITED STATES PATENTS

| | | | |
|---|---|---|---|
| 3,055,776 | 9/1962 | Stevenson | 148—187 X |
| 3,145,126 | 8/1964 | Hardy | 148—187 |
| 3,200,019 | 8/1965 | Scott | 148—187 |

HYLAND BIZOT, Primary Examiner